(12) United States Patent
Müller-Rissmann et al.

(10) Patent No.: US 6,522,392 B1
(45) Date of Patent: Feb. 18, 2003

(54) OPTICAL SYSTEMS AND METHODS OF COMPENSATING ROTATIONALLY NON-SYMMETRICAL IMAGE DEFECTS IN AN OPTICAL SYSTEM

(75) Inventors: Werner Müller-Rissmann, Oberkochen (DE); Hubert Holderer, Königsbronn (DE); Rudolf Von Bünau, Essingen (DE); Christian Wagner, Aalen (DE); Jochen Becker, Oberkochen (DE); Stefan Xalter, Oberkochen (DE); Wolfgang Hummel, Schwabisch Gmund (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/721,452

(22) Filed: Nov. 22, 2000

(30) Foreign Application Priority Data

Nov. 24, 1999 (DE) .......................................... 199 56 354

(51) Int. Cl.⁷ .......................... G03B 27/68; G03B 27/42; G03B 27/54
(52) U.S. Cl. ............................. 355/67; 355/53; 355/52
(58) Field of Search .............................. 355/52, 53, 67

(56) References Cited

U.S. PATENT DOCUMENTS 5,442,184 A   8/1995   Palmer et al.
5,852,518 A * 12/1998   Hatasawa et al. ........ 250/492.2
5,883,704 A   3/1999   Nishi et al.

FOREIGN PATENT DOCUMENTS

DE   A 198 27 603   12/1999
EP   B 0 532 236    7/1997
JP   A 08 181 058   7/1996

OTHER PUBLICATIONS

*Impossible—but put into practice: 100* UV–Systems manually sprayed, I–Lack, 12/98, pp.

\* cited by examiner

*Primary Examiner*—Russell Adams
*Assistant Examiner*—Andrew Sever
(74) *Attorney, Agent, or Firm*—Factor & Partners

(57) ABSTRACT

An optical system, in particular a microlithographic projection printing installation, has in particular a slot-shaped image field or rotationally non-symmetrical illumination. The system comprises a light source (30) as well as at least one optical element, in particular a lens or a mirror. In the region of at least one surface acted upon by the radiation (1) of the light source (30) the optical element is substantially symmetrical in relation to an axis of rotational symmetry (5). The optical element or its housing (6) is rotatably connected to a frame (7) by at least one bearing (8, 9, 10). An actuator (18) sets the optical element (25) or its housing (6) in rotation about the axis of rotational symmetry (5). The actuation cooperates with a control device (23). The latter activates the actuator (18) for rotation of the optical element at least temporarily during the period, when the optical element is exposed to lumination. In such a manner rotationally non-symmetrical image defects are compensated.

5 Claims, 2 Drawing Sheets

Figure 1:
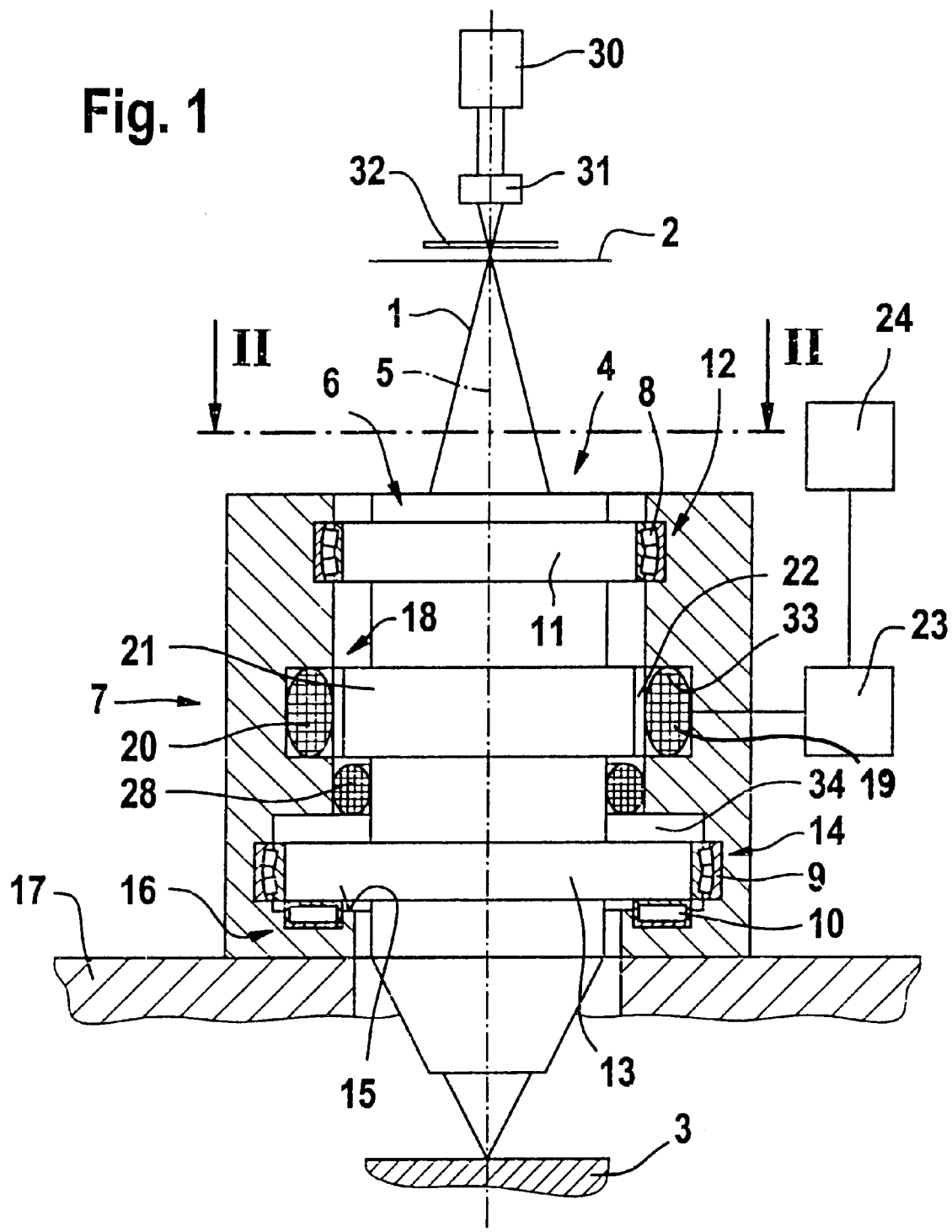

OPTICAL SYSTEMS AND METHODS OF COMPENSATING ROTATIONALLY NON-SYMMETRICAL IMAGE DEFECTS IN AN OPTICAL SYSTEM

The invention relates to an optical system, in particular a microlithographic projection printing installation, in particular having a slot-shaped image field or rotationally non-symmetrical illumination, a) having a light source;

b) having at least one optical element, in particular a lens or a mirror, which ba) comprises at least one surface acted upon by radiation of the light source; and bb) the basic shape of which at least in the region of the at least one surface acted upon by radiation is substantially symmetrical relative to an axis of rotational symmetry.

The invention further relates to methods of compensating rotationally non-symmetrical image defects in such an optical system, through which a light beam is passed.

The imaging quality of such an optical system is often impaired by rotationally non-symmetrical image defects. Such image defects arise, for example, as a result of rotationally non-symmetrical heating of the at least one optical element of the optical system or as a result of other effects, such as e.g. compaction, which lead to a corresponding rotationally non-symmetrical expansion and/or refractive index distribution in the optical element. Such rotationally non-symmetrical heating may be lumination-induced but may also have other causes, e.g. a rotationally non-symmetrical thermal coupling of the optical element to its surroundings or some other rotationally non-symmetrical thermal influence upon the optical element. Other causes of rotationally non-symmetrical image defects may be, for example, material irregularities or variations in the shape of the irradiated surface of the optical element.

The object of the present invention is to compensate and/or render symmetrical rotationally non-symmetrical image defects of the at least one optical element of the optical system in order to improve the imaging quality.

Said object is achieved according to the invention in that c) the optical element or its housing is rotatably connected to a frame by at least one bearing;

d) an actuator is provided, which sets the optical element or its housing in rotation about the axis of rotational symmetry; wherein e) the actuator cooperates with a control device, which activates the actuator at least temporarily during the period, when the optical element is exposed to lumination, for rotation of the optical element.

Where the rotationally non-symmetrical image defects are light- or heat-induced, their very formation may be prevented or at least reduced by the arrangement according to the invention through rotation of the optical element. The rotation in said case has to be effected within a time which is short, measured against the time constant of the formation of lumination-induced image defects.

Where rotationally non-symmetrical image defects are not light- or heat-induced, they may be compensated by the arrangement according to the invention provided that the rotation is effected quickly compared to the lumination time.

This leads, as a whole, to rotationally at least substantially symmetrical imaging properties. By virtue of rendering the imaging properties symmetrical in said manner, either the optical system has an adequately good imaging quality without further corrections or a relatively simple correction with additional rotationally symmetrical optical correction elements becomes possible.

The actuator may be formed by an electric drive having a frame-fixed stator and a rotor non-rotatably connected to the optical element, wherein an air gap remains between the rotor and a stator non-rotatably connected to the frame. Such an electric drive allows precise rotation of the optical element without causing vibrations.

Electrical equipment which co-rotates with the optical element may be connected by cable to a power supply. Such a power supply, which is naturally possible only if the optical element does not rotate always in one direction of rotation, is inexpensive.

Alternatively, electrical equipment which co-rotates with the optical element may be connected by an inductive coupling device to a power supply. Such a power supply is possible also with an optical element, which rotates always in one direction of rotation, and unlike sliding contacts, which are equally possible in such a situation, is wear-free. The possibility of vibrations being transmitted via a sliding contact to the optical element and impairing its imaging quality also does not apply.

At least one bearing may be a magnet bearing. Such bearings may be used for contactless support, in which case vibrations during rotation are likewise avoided.

Alternatively or additionally at least one hydrostatic bearing or an air bearing may be provided. With such bearings also, hardly any vibrations or no vibrations at all are transmitted during rotation.

Instead of the electric drive, the actuator may be formed by a mechanically operating drive with a gear. Such an actuator is inexpensive and, independently of the manufacturing tolerances, likewise enables precise rotation of the optical element.

When a worm gear is used as a gear, it is possible with a relatively high driving speed to achieve a slow rotation of the optical element. This is beneficial for isolation of the optical element from the drive vibrations.

Alternatively, the gear may be a bevel gear. With such a gear it is possible to realize high rotational speeds during rotation of the optical element so that, even in the case of a short lumination time, image defects may be rendered symmetrical in accordance with the invention.

In a preferred form of construction, at least one optical element, which is held with further optical elements in a common housing, is rotatable relative to the housing. The optical elements which present the most pronounced rotationally non-symmetrical image defects may be selected to be rotatable. The other optical elements in the housing may be of a non-rotatable design, thereby increasing the stability of an optical system which comprises said optical elements. In particular, the housing may be of a non-rotatable design, thereby avoiding the supply line connection problems which might arise with a rotating housing. An additional advantage arises from the fact that through the rotation of one optical element image defects of other, non-rotated optical elements may be compensated.

Alternatively, a housing containing a plurality of optical elements may be provided, which is rotatably connected to a frame. In said case, all of the optical elements inside the housing are rotated with the latter. The optical system composed of said optical elements may therefore be inherently very stable.

A further object of the invention is to develop a method of the type described initially in such a way that rotationally non-symmetrical image defects are rendered symmetrical in a particularly effective manner.

Said object is achieved in a variant of the method according to the invention by the following process steps:

a) rotation of the optical element through a specific angle of rotation;

b) reverse rotation of the optical element through a specific angle of reverse rotation.

In most cases, continuous rotation of the optical element in one direction of rotation is not necessary to render rotationally non-symmetrical image defects symmetrical. When the optical element is merely rotated back and forth through specific angles of rotation, the optical system may be of a mechanically simplified design. In addition, supplying power to electrical equipment co-rotating with the optical element is simplified because, as a rule, trailing cables may be used.

The control device may activate the reversal points between the two directions of rotation within an angle-of-rotation range at an identical relative rate of occurrence. This prevents the optical element from changing its direction of rotation always at the same reversal point, which may result in unilateral loading of the optical system.

The optical element may be rotated in relation to a starting position in accordance with the symmetry of the radiated power distribution in the light beam through a fraction of a full revolution. The higher the order of said symmetry, the lower the angle of rotation needed to render the image defects symmetrical. And the mechanical design and the power supply of the optical system become correspondingly simpler.

An alternative method of compensating rotationally non-symmetrical image defects in accordance with the invention comprises the following process steps:

a) compared to the time constant of the formation of image defects induced by the radiation of the light source, fast rotation of the optical element through a specific angle of rotation;

b) maintaining of the position of the optical element for a dwell period, which is long compared to the duration of rotation and short compared to the time constant of the formation of image defects induced by the radiation of the light source;

c) compared to the time constant of the formation of image defects induced by the radiation of the light source, fast reverse rotation of the optical element through a specific angle of reverse rotation.

Such a rotation sequence for compensating lumination-induced image defects leads, assuming a suitable symmetry of the image defects, to a further reduction of the angle of rotation needed to produce rotationally substantially symmetrical imaging properties of the optical system. The effect achieved by rotating the optical element at a speed which is fast compared to the dwell period is that imaging changes of the optical element, which are caused by irradiation of the regions of the optical element which are irradiated only during rotation, are of no consequence compared to imaging changes, which arise in the regions of the optical element which are irradiated during the dwell period.

The image defects induced during the dwell period in the extreme positions between rotations cancel each other out, given suitable adaptation of the dwell time and of the angle of rotation to the time constant of the formation of the lumination-induced image defect and to the symmetry of the latter, in such a way that, on the whole, rotationally substantially symmetrical imaging properties result.

The optical element may be rotated in relation to a starting position in accordance with the symmetry of the radiated power distribution in the light beam through a fraction of a full revolution. With the alternative method also, given multiple-order symmetry of the lumination-induced image defects, the already previously described additional reduction of the absolute angle of rotation is possible.

In a further alternative method of compensating rotationally non-symmetrical image defects in accordance with the invention, the optical element is rotated at a preset rotational speed. Such rotation is possible with a simple drive controller.

The optical element, while being acted upon by the light beam, may be rotated through a plurality of revolutions. By said means image defects, which are formed in a light-induced manner with a relatively short time constant or are not light-induced, are also rendered symmetrical. Even a plurality of mutually independent, rotationally non-symmetrical image defects are reliably rendered symmetrical by said means.

Figure 2:
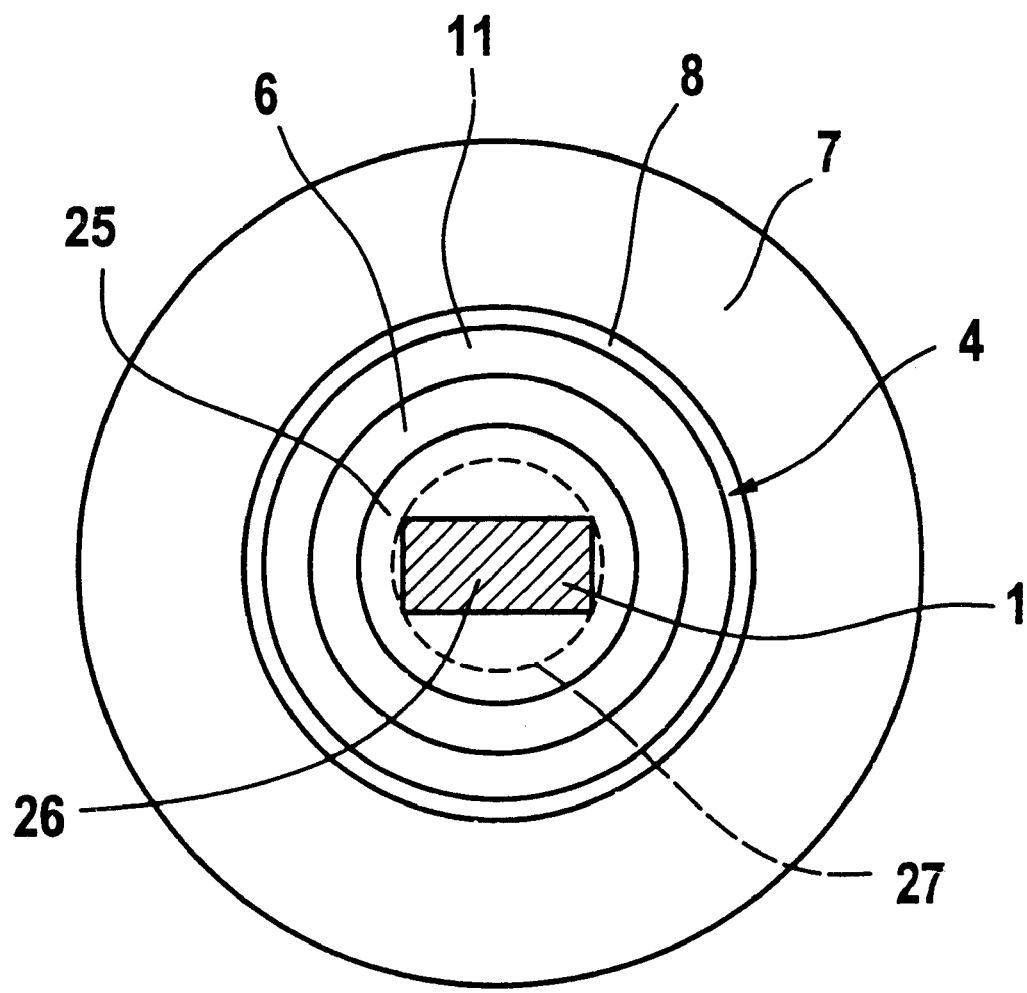

An embodiment of the invention is described in detail below with reference to the drawings; the drawings show:

FIG. 1: a part-sectional view of a rotatably supported projection lens system in an optical system according to the invention; and FIG. 2: a plan view of the projection lens system according to line II—II of FIG. 1.

FIG. 1 shows a cutout from a microlithographic projection printing installation. A projection light beam 1 is produced by a light source 30, generally by a laser with a short emission wavelength, e.g. an argon-fluoride excimer laser, and brought into focus by focusing optics 31. The beam cross section of the projection light beam 1, which is additionally described below, is delimited by a mask 32 situated downstream of the focusing optics 31 for defining a slot-shaped image field of the projection printing installation.

A reticle 2, which is illuminated by the projection light beam 1 and disposed downstream of the mask 32 and carries the structural information to be projected, is imaged onto a wafer 3. The mask 32, the reticle 2 and the wafer 3 are illustrated only diagrammatically in FIG. 1.

A projection lens system 4 is used as an optical unit for imaging the reticle 2 onto the wafer 3. It comprises a plurality of lenses (cf. lens 25 in FIG. 2), which are disposed in a rotationally symmetrical manner relative to an optical axis 5 of the projection lens system 4 and mounted inside a lens system housing 6. Said lenses are made of material which is highly transparent to UV light, such as e.g. quartz glass or $CaF_2$.

The lens system housing 6 is supported in a lens system frame 7 so as to be rotatable about the optical axis 5. Both the lens system housing 6 and the lens system frame 7 are, as far as their mechanical components are concerned, arranged in a rotationally symmetrical manner about the optical axis 5. The lens system frame 7 is in turn carried by a supporting frame 17, which is shown only in a cutout manner in FIG. 1.

Three bearings are used to support the lens system housing 6 in a rotatable manner: a top radial bearing 8, a bottom radial bearing 9 and a thrust bearing 10. Said three bearing units are likewise arranged in a rotationally symmetrical manner about the optical axis 5.

The top radial bearing 8 is disposed, in relation to the lens system housing 6, at a level adjacent to the entrance plane of the projection light beam 1 into the lens system housing 6. The top radial bearing 8 is connected to the lens system housing 6 by a top housing ring 11, which closes non-rotatably around the lens system housing 6. The top radial bearing 8 lies with its radially outer region in a receiver 12 of the lens system frame 7.

The bottom radial bearing 9 is disposed, in relation to the lens system housing 6, at a level adjacent to the exit plane of the projection light beam 1 from the lens system housing 6. Like the top radial bearing 8, the bottom radial bearing 9 is connected to the lens system housing 6 by a bottom housing ring 13, which closes non-rotatably around the lens system housing 6. The bottom radial bearing 9 lies with its radially outer region in a receiver 14 of the lens system frame 7.

The bottom housing ring 13 is supported axially via the thrust bearing 10 against a circumferential shoulder 15 of the lens system frame 7. The circumferential shoulder 15 is part of an annular circumferential recess 32 in the inner lateral surface of the lens system frame 7 in the region of the bottom housing ring 13. Formed in the circumferential shoulder 15 is a receiver 16, in which the thrust bearing 10 is partially accommodated.

For most projection printing applications, the positional accuracy achievable during rotation of the lens system housing 6 by means of ball bearings or rolling-contact bearings as bearing units 8, 9, 10 is inadequate. For said reason, as bearing units 8, 9, 10 magnet bearings are used, which operate without contact and with which the components to be supported repel one another by means of magnetic forces. Alternatively, hydrostatic bearings or air bearings may be used.

An electric drive 18, which is diagrammatically illustrated in FIG. 1, is used to rotate the lens system housing 6 about the optical axis 5. For said purpose, a receiver 19 of the lens system frame 7 accommodates a stator ring 20, in the rotating field of which a rotor ring 21 equipped with permanent magnets is disposed. Said rotor ring is non-rotatably connected to the lens system housing 6. The stator ring 20 is in said case disposed in a known manner coaxially around the rotor ring 21 and an air gap 22 is left between them so as to produce a contactless drive. Cable windings 33 formed in the stator ring 21 are diagrammatically indicated in FIG. 1.

The electric drive 18 is operated by means of a drive controller 23. The drive controller 23 has a communication link to a printing controller 24.

A possible alternative to the described contactless electric drive is a mechanically operating drive of the lens system housing 6 in the lens system frame 7, e.g. via a worm gear or bevel gear (neither of which is shown in the drawing). Such a worm gear comprises a worm having an axis of rotation, which is fixed relative to the lens system frame 7 and extends tangentially to the circumference of the lens system housing 6. The worm engages into a worm wheel, which is designed as a ring around the lens system housing 6 and firmly connected to the latter.

An annular inductive coupling device 28 is used to supply power to the electrical equipment co-rotating with the projection lens system 4. Alternatively, the power supply may be effected via sliding contacts.

The plan view, shown in FIG. 2, of the part of the optical system having the projection lens system 4 reveals its rotationally symmetrical construction. In the lens system housing 6 a lens 25 of the projection lens system 4 is disposed and is the first lens in the optical path of the projection light beam 1. The projection light beam 1 penetrates the lens 25 with a rectangular cross-sectional area 26, which is shown as a hatched area in FIG. 2. The cross-sectional area 26 shown in FIG. 2 has a side length ratio of the longitudinal side to the narrow side of roughly 2:1.

The projection printing installation is operated in the following manner:

The lenses in the lens system housing, e.g. the lens 25, heat up as a result of the residual absorption which the material, from which they are made, still presents in the region of the wavelength of the projection light beam 1. Said heating, the temperature distribution of which in a first approximation follows the absorbed radiated power distribution in the lenses, leads both to thermal expansion of the material and to a change of refractive index and therefore, because of the altered refractive properties, to a change of the imaging properties of the lenses. The purpose of rotating the projection lens system 4 is, by making the absorption of the projection light beam 1 in the lenses symmetrical, on time average to make the temperature distribution in the latter symmetrical. A resulting rotationally symmetrical thermal expansion leads to image defects which are negligible and/or easy to control.

During a printing operation the lens system housing 6 is rotated by the electric drive 18, wherein the axis of rotation of the lens system housing 6 coincides with the optical axis 5. The sequence of rotation, which is yet to be described, is preset by the printing controller 24 and controlled via the drive controller 23.

By virtue of the rotation on time average a region of the lenses of the projection lens system 4, which is rotationally symmetrical about the optical axis 5, is permeated by the projection light beam 1. The edge contour of said rotationally symmetrical region is indicated by a dashed line 27 in FIG. 2.

Should the radiated power distribution of the projection light beam 1 over the cross-sectional area 26 be mirror-symmetrical, the following applies: when the lenses execute a half turn, the distribution of the radiated power integrated over the corresponding time and absorbed in the lenses is homogeneous.

Given any radiated power distribution over the cross-sectional area 26 of the projection light beam 1, the result is uniform irradiation with integration over the time corresponding to a full turn of the projection lens system 4.

To achieve such uniform irradiation, several possible alternative ways of rotating the projection lens system 4 exist:

In a first form of construction, the projection lens system 4 is rotated back and forth through a specific angle of rotation.

The lenses within the projection lens system 4 absorb only a small portion of the projection light beam 1 and therefore heat up only relatively slowly. Image defects arising from said heating are also already compensated by a relatively slow rotation because, here, a sufficiently high degree of symmetry of the temperature distribution in the lenses is already achieved. Given a typical time constant of 100 seconds for the heating of a lens following exposure to a projection light beam, a time interval between the end positions or extreme positions of the rotation through a specific angle of rotation of typically 30 seconds is sufficient to achieve a satisfactory degree of symmetry.

The angle of rotation for a mirror-symmetrical radiated power distribution in the cross-sectional area 26, as mentioned above, may be 180°.

Should the radiated power distribution be symmetrical relative to two perpendicular planes of symmetry, the angle of rotation may alternatively be only 90°. The 90° rotation then has to be effected quickly enough for the absorption of the material of the lenses of the projection lens system 4 during said rotary operation to be negligibly low compared to the absorption in the end positions. A typical sequence of such a rotation program, again assuming a typical heating time constant of 100 seconds, would be: rotation through 90° in 5 s, dwell of the projection lens system for 30 s, reverse rotation through 90° in 5 s, dwell of the projection lens system for 30 s.

The distribution of the radiated power absorbed by virtue of such a sequence is admittedly not rotationally symmetrical but comes closer to a rotationally symmetrical distribution than the distribution of the radiated power which would be absorbed without rotation of the projection lens system 4. In the case of the cross-sectional area 26 of the projection light beam on the lens 25 shown in FIG. 1, a cross-shaped radiated power distribution arises. In a corresponding manner the imaging properties of a projection lens system 4 rotated in said manner are improved compared to one which is not rotated.

When rotation is effected only through a specific angle of rotation, then, instead of or in addition to the previously described inductive supply, electric supply lines to the lens system housing 6 may take the form of standard trailing electric cables, which are laid with appropriate play.

Instead of rotating through specific angles of rotation, the lens system housing 6 may rotate at a specific rotational speed in the lens system frame 7. Given the previously described time response of the heating of the lenses of the projection lens system 4, a full revolution in 30 seconds is likewise enough to achieve an adequate degree of symmetry of the temperature distribution in the lenses of the projection lens system 4. A rotation of the projection lens system 4 at a higher rotational speed offers the possibility of compensating other rotationally non-symmetrical image defects resulting e.g. from the adjustment of the projection lens system, from aberrations or from irregularities in the lenses. To compensate such image defects, the rotational speed has to be high enough for the lens system housing 6 to execute a plurality of revolutions, e.g. more than five revolutions, during a printing operation.

In the case of rotation of the projection lens system 4 back and forth through a specific angle of rotation, it may be advantageous for the reversal point of the rotation to be selected not always at the same angle-of-rotation position of the lens system housing 6 relative to the lens system frame 7 in order to apportion mechanical or thermal loads, which arise during the dead time of said reversal operation, more uniformly to the possible rotary positions of the lens system housing 6. To said end, selection of the respective angle of rotation is effected by the drive controller 23 in such a way that the reversal point varies within a preset angle-of-rotation range. To guarantee a radiated power distribution which is as rotationally symmetrical as possible, said angle-of-rotation range should be relatively small, e.g. it should comprise a few angular degrees. In order to distribute the load, the reversal points possible within said angle-of-rotation range should, as far as possible, be activated at an identical relative rate of occurrence, e.g. by continuous rasterizing during successive reversal operations in an angle-of-rotation range.

Such compensation of heat-induced image defects using rotation is not limited to refractive optical elements and is equally applicable to reflective optical elements such as mirrors. So that the reflection is independent of the rotation, the axis of rotation of a reflective optical element has to coincide with its axis of rotational symmetry.

In the embodiment of FIGS. 1 and 2 the lens system housing 6 with all of the optical elements situated therein is rotatable. In an alternative form of construction only selected optical elements within the projection lens system are rotatable. Selecting which optical elements are to be of a rotatable design is effected on the basis of the extent of the rotationally non-symmetrical image defects induced there. In a given projection lens system, the rotatably designed optical elements are preferentially those, in which a rotationally highly non-symmetrical load per unit area by the light beam leads to a relatively extreme rotationally non-symmetrical image defect.

Individual lenses may be disposed rotatably within the projection lens system e.g. on air bearings or, assuming that there is a suitable mount, on magnet bearings. The lens system housing in said embodiment may be of a non-rotatable design so that connecting leads, e.g. for manipulators provided in the projection lens system, may be of a conventional design.

In said embodiment the rotation of individual optical elements in the sense of the previously described rotation program may also be effected, so that, for example, the rotatable lens is rotated into a position, in which image defects of other lenses are compensated, and the rotatable lens remains in said position until the compensating effect departs from a preset tolerance value on account of the new load per unit area by the projection light beam. The rotatable lens is then rotated further into a new preset position.

What is claimed is:

1. A method of compensating rotationally non-symmetrical image defects in an optical system, the optical system comprising a microlithographic projection printing installation:
    a) having a light source;
    b) having an optical element, which
        ba) comprises at least one surface acted upon by radiation of the light source; and
        bb) the basic shape of which at least in the region of the at least one surface acted upon by radiation is substantially symmetrical relative to an axis of rotational symmetry,
wherein
    c) the optical element (25) or its housing (6) is rotatably connected to a frame (7) by at least one bearing (8, 9, 10);
    d) an actuator (18) is provided, which sets at least one of the optical element (25) and its housing (6) in rotation about the axis of rotational symmetry; wherein
    e) the actuator (18) cooperates with a control device 923), which activates the actuator (18) at least temporarily during the period, when the optical element (25) is exposed to rumination, for rotation of the optical element (25);
wherein the method has the following process steps:
    a) rotation of the optical element (25) through a specific angle of rotation;
    b) reverse rotation of the optical element (25) through a specific angle of reverse rotation.

2. A method as claimed in claim 1, wherein by means of the control device (23) the reversal points between the two directions of rotation within an angle-of-rotation range are activated at an identical relative rate of occurrence.

3. A method as claimed in one of claim 1, wherein the optical element (25) is rotated in relation to a starting position in accordance with the symmetry of the radiated power distribution in the light beam through a fraction of a full revolution.

4. A method of compensating rotationally non-symmetrical image defects in an optical system, through which a light beam is passed, the optical system comprising a microlithographic projection printing installation:

a) having a light source;

b) having an optical element, which
      ba) comprises at least one surface acted upon by radiation of the light source; and
      bb) the basic shape of which at least in the region of the at least one surface acted upon by radiation is substantially symmetrical relative to an axis of rotational symmetry, wherein c) the optical element (25) or its housing (6) is rotatably connected to a frame (7) by at least one bearing (8, 9, 10);

d) an actuator (18) is provided, which sets at least one of the optical element (25) and its housing (6) in rotation about the axis of rotational symmetry; wherein e) the actuator (18) cooperates with a control device 923), which activates the actuator (18) at least temporarily during the period, when the optical element (25) is exposed to rumination, for rotation of the optical element (25);

wherein the method has the following process steps:

a) compared to the time constant of the formation of image defects induced by the radiation (1) of the light source (30), fast rotation of the optical element (25) through a specific angle of rotation;

b) maintaining of the position of the optical element (25) for a dwell period, which is long compared to the duration of rotation and short compared to the time constant of the formation of image defects induced by the radiation (1) of the light source (30);

c) compared to the time constant of the formation of image defects induced by the radiation (1) of the light source (30), fast reverse rotation of the optical element (25) through a specific angle of reverse rotation.

5. A method as claimed in claim 4, wherein the optical element (25) is rotated in relation to a starting position in accordance with the symmetry of the radiated power distribution in the light beam through a fraction of a full revolution.

\* \* \* \* \*